(12) United States Patent
Ishiguro

(10) Patent No.: US 7,843,258 B2
(45) Date of Patent: Nov. 30, 2010

(54) FILTER CIRCUIT

(75) Inventor: Kazuhisa Ishiguro, Gunma (JP)

(73) Assignee: Ricoh Co., Ltd., Tokyo (JP)

( * ) Notice: Subject to any disclaimer, the term of this patent is extended or adjusted under 35 U.S.C. 154(b) by 463 days.

(21) Appl. No.: 11/995,025

(22) PCT Filed: Feb. 8, 2006

(86) PCT No.: PCT/JP2006/302567

§ 371 (c)(1),
(2), (4) Date: Jan. 8, 2008

(87) PCT Pub. No.: WO2007/007439

PCT Pub. Date: Jan. 18, 2007

(65) Prior Publication Data

US 2010/0117724 A1     May 13, 2010

(30) Foreign Application Priority Data

Jul. 8, 2005    (JP) ............................. 2005-199684

(51) Int. Cl.
*H03K 5/00* (2006.01)
(52) U.S. Cl. ...................................... 327/556; 327/552
(58) Field of Classification Search ................. 327/552, 327/556, 558, 559, 557
See application file for complete search history.

(56) References Cited

U.S. PATENT DOCUMENTS

| 3,375,451 | A | * | 3/1968 | Borelli et al. | 327/556 |
| 3,638,037 | A | * | 1/1972 | McMurtrie | 327/557 |
| 6,020,783 | A | * | 2/2000 | Coppola | 327/556 |
| 6,552,604 | B2 | * | 4/2003 | Cargille | 327/556 |
| 6,867,642 | B1 | * | 3/2005 | Maqueira | 327/556 |

FOREIGN PATENT DOCUMENTS

| JP | 2179111 | 7/1990 |
| JP | 6314951 | 11/1994 |
| JP | 2001077716 | 3/2001 |

OTHER PUBLICATIONS

International Search Report, International Application No. PCT/JP2006/302567.

* cited by examiner

*Primary Examiner*—Hai L Nguyen
(74) *Attorney, Agent, or Firm*—Connolly Bove Lodge & Hutz LLP

(57) ABSTRACT

A plurality of low-pass filters ($2_{-1}$, $2_{-2}$, $2_{-3}$) are cascaded to the post stage of an OTA (1) and a plurality of high-pass notch filters ($3_{-1}$, $3_{-2}$, $3_{-3}$) are cascaded further to the post-stage thereof so that a high-pass filter having a Q is not connected to the output of the OTA (1) having a high output impedance and a capacitor having a low capacitance is not connected with the output of th OTA (1) thus preventing multifeedback and avoiding such problems as the zero point of the notch filter (BEF) deviates from a design value or oscillation takes place.

3 Claims, 6 Drawing Sheets

FILTER CIRCUIT

TECHNICAL FIELD

The present invention relates to a filter circuit, and is particularly suitable for use in a filter circuit in which a high-pass notch filter and a low-pass notch filter are combined to constitute a band-pass filter, and a current output, type buffer amplifier is connected to its input stage.

BACKGROUND ART

Generally, a radio receiver uses an IF filter, which applies band limitation to an intermediate frequency signal (IF signal) generated by performing frequency conversion of a received high-frequency signal (RF signal) in order to generate an intermediate frequency signal including a desired reception frequency. A band-pass filter is used for the IF filter.

When creating a band-pass filter having a large Q, a biquad type filter is often used. The biquad type filter is a 2-dimensional filter constructed of three operational amplifiers, which is highly accurate in its center frequency and allows for a considerably large Q value.

In addition, the band-pass filter can be constructed as a combination of a high-pass notch filter (HPN) and a low-pass notch filter (LFN) (e.g., refer to patent document 1: Japanese Patent Laid-Open No, 2001-77716).

That is, as illustrated in FIG. 1, it is possible to constitute a band-pass filter with a center frequency $f_o$ by combining a high-pass notch filter having a high-pass notch point frequency $f_H$ with a low-pass notch filter having a low-pass notch point frequency $f_L$. It is possible to change a band width of a pass band by adjusting the high-pass notch point frequency $f_H$ and the low-pass notch point frequency $f_L$.

A notch filter can be constructed of a low-pass filter, a high-pass filter, and an adder for adding an output of the low-pass filter and an output of the high-pass filter. Here, a BEF (Band Elimination Filter) with a high-pass notch can be constructed by combining the high-pass filter having a high Q with the low-pass filter having a low Q, and a BEF with a low-pass, notch can be constructed by combining the high-pass filter having a low Q with the low-pass filter having a high Q.

When a band-pass filter is constructed using a time-series analog filter by CMOS process, an RC active filter, a Gm-C filter, a MOSFET-C filter, or the like is used for the analog filter. The RC active filter is constructed using an operational amplifier, a resistor and a capacitor, which applies to an IF filter amplifier described in the above-mentioned patent document 1. The Gm-C filter is a filter constructed of a Gm amplifier, which converts an input voltage signal into an output current signal, and a capacitor, and can change characteristics of the filter by changing transconductance Gm. The MOSFET-C filter is a filter constructed by combining a MOSFET, which is used as a resistor, with a capacitor.

FIG. 2 is a diagram illustrating an example of a conventional filter circuit constructed using a notch filter with a Gm-C filter. A filter circuit illustrated in FIG. 2 is constructed having an OTA (Operational Transconductance Amplifier) 101, a high-pass notch filter (HPN) 102, and a low-pass notch filter (LPN) 103. The HPN 102 is constructed by combining a high-pass filter having a high Q with a low-pass filter having a low Q. In addition, the LFN 103 is constructed by combining a high-pass filter having a low Q with a low-pass filter having a high Q.

An adder provided on the LPN 103 operates as an Output buffer amplifier. On the other hand, the OTA 101 is used as a buffer amplifier on an input side of the HPN 102. The OTA 101 is a current output type because of its circuit structure and has a large output impedance. On the other hand, the HPN 102 connected with an output of the OTA 101 is equipped with a high-pass filter having a high Q as mentioned above. When this is constructed of a Gm-C filter, a capacitance of a capacitor connected, with an input stage becomes small.

Nevertheless, when a high-pass filter having a high Q is connected with the output of the OTA 101 having a large output impedance, a buffer effect of the OTA 101 becomes not so expectable under the influence of the capacitor having a small capacitance and being connected with the input stage of the high-pass filter. This may result in multifeedback, and a problem of a zero point of a BEF deviating from a design value and a problem of oscillation and the like are likely to arise. These problems arise also when a current output differential amplifier is used instead of the OTA 101.

DISCLOSURE OF THE INVENTION

The present invention is made in order to solve such problems, and aims at being able to avoid the problem of a zero point of a BEF deviating from a design value, the problem of oscillation, and the like, and to obtain characteristics in accordance with design values in a filter circuit constructed using a current output type buffer amplifier, and a notch filter (BEF) with a Gm-C filter.

In order to solve the problems mentioned above, in a filter circuit of the present invention, a low-pass notch filter is connected in a post-stage of a current output type buffer amplifier, and a high-pass notch filter is connected in its further post-stage.

According to the present invention constructed as described above, a high-pass filter having a high Q is not connected with an output of a buffer amplifier having a large output impedance, and a capacitor having a small capacitance is not connected with the output of the buffer amplifier. Thereby, it is possible to prevent multifeedback and to avoid such problems that a zero point of a notch filter (BEF) deviates from a design value, and that oscillation takes place. In addition, since a high-pass notch filter including a capacitor having a small capacitance is connected after a low-pass notch filter that does not have a capacitor having a small capacitance, it is possible to reduce the influence of a capacitor having a small capacitance on a large output impedance of the buffer amplifier as much as possible, and hence, it is possible to achieve desired characteristics in accordance with design values.

BEST MODE FOR CARRYING OUT THE INVENTION

Figure 1:
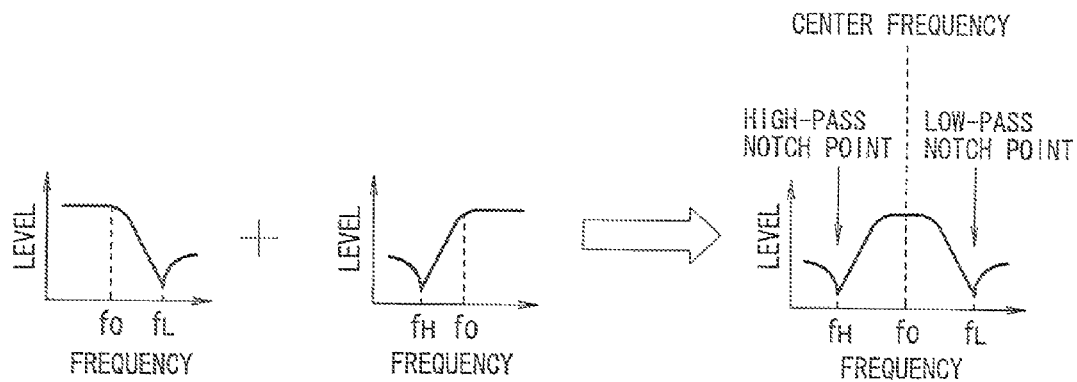
FIG. 1 includes characteristic charts illustrating an example of constructing a band-pass filter by combining a high-pass notch filter with a low-pass notch filter.
Figure 2:
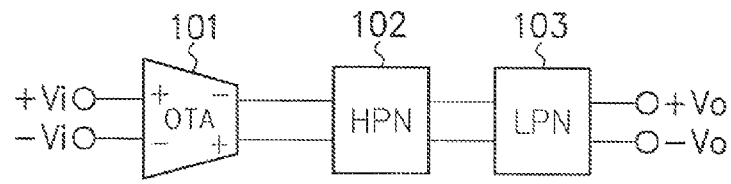
FIG. 2 is a block diagram illustrating a structural example of a conventional filter circuit.
Figure 3:
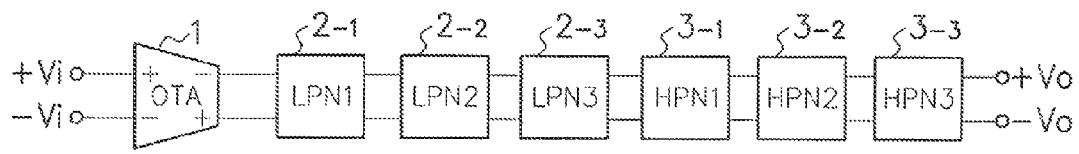
FIG. 3 is a block diagram illustrating a structural example of a filter circuit according to the embodiment.
Figure 4:
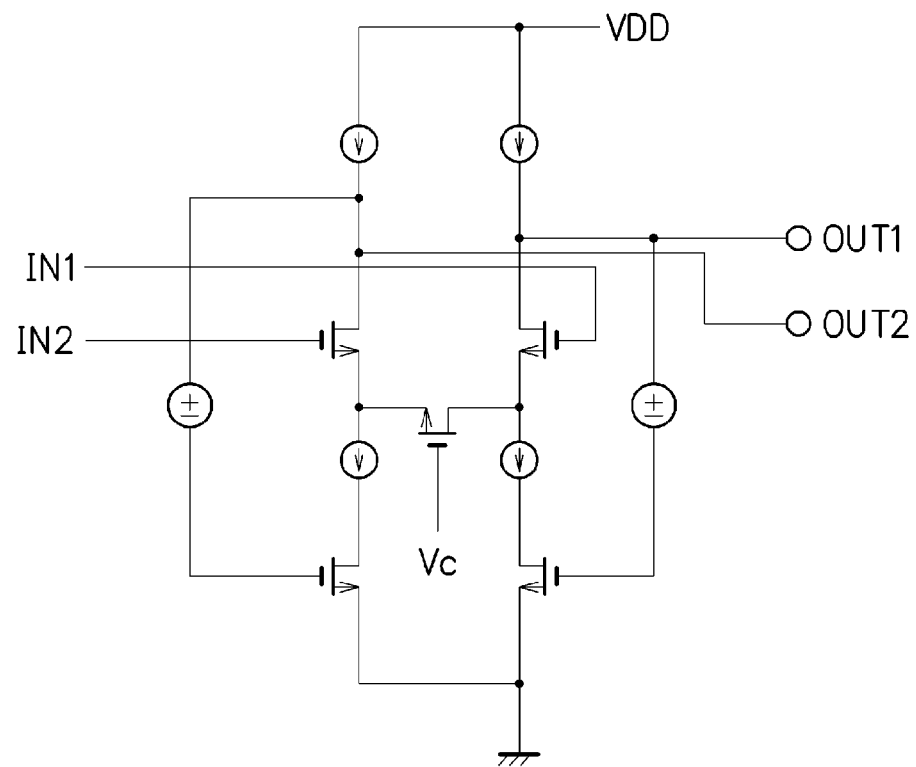
FIG. 4 is a diagram illustrating a structural example of an OTA used for the filter circuit according to the embodiment.
Figure 5:
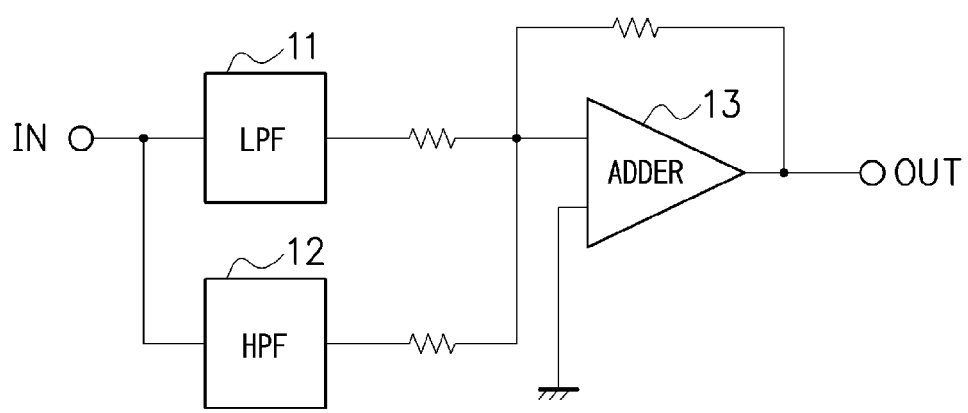
FIG. 5 is a diagram illustrating a structural example of a notch filter according to the embodiment.
Figure 6:
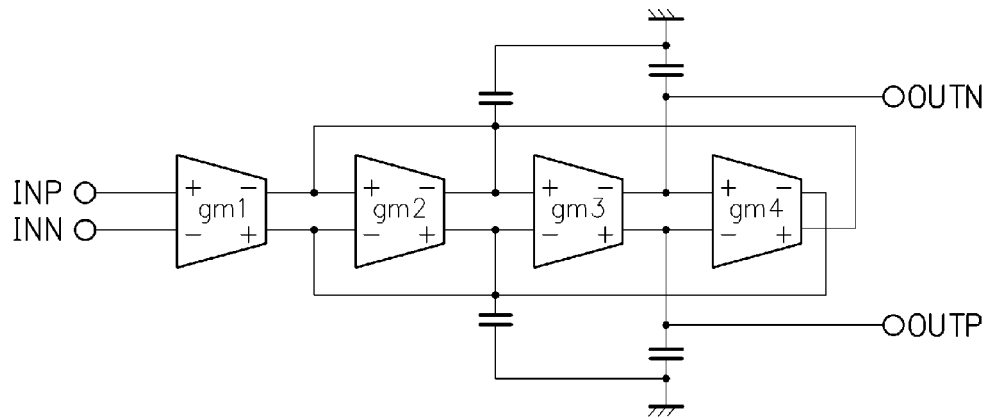
FIG. 6 is a diagram illustrating a structural example of a low-pass filter constructed of a Gm-C filter.
Figure 7:
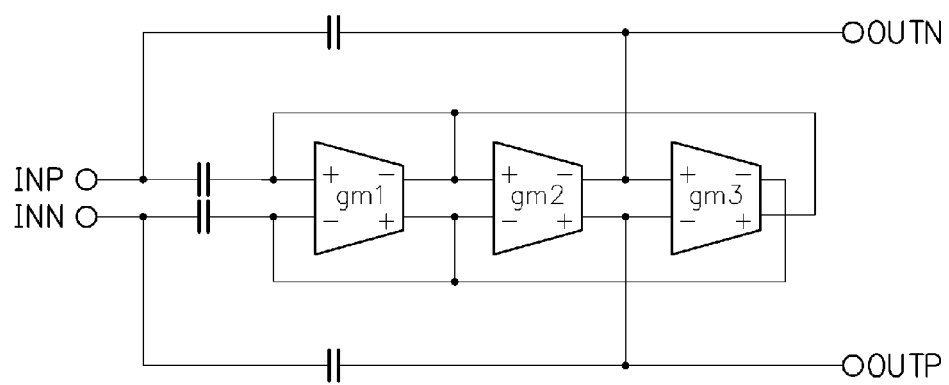
FIG. 7 is a diagram illustrating a structural example of a high-pass filter which has a low Q and is constructed of a Gm-C filter.
Figure 8:
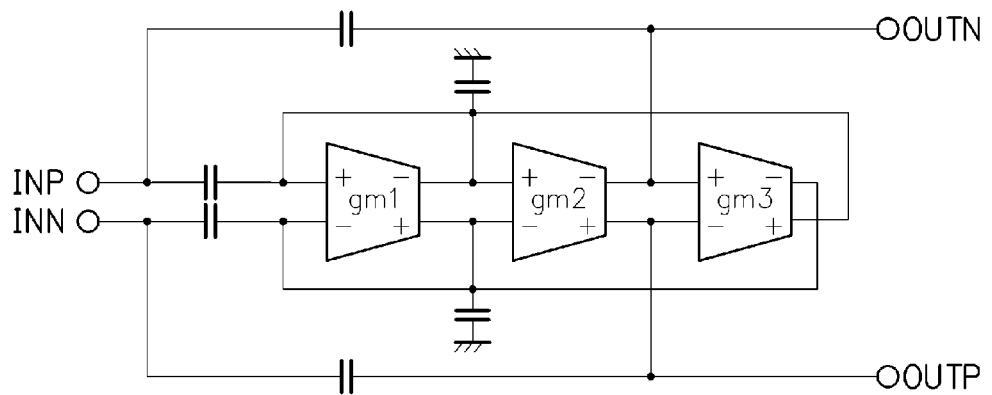
FIG. 8 is a diagram illustrating a structural example of a high-pass filter which has a high Q and is constructed of a Gm-C filter.

An embodiment of the present invention will be described below on the basis of drawings. FIG. 3 is a block diagram illustrating a structural example of a filter circuit according to the embodiment. FIG. 4 is a diagram illustrating a structural example of an OTA used for the filter circuit according to the embodiment. FIG. 5 is a diagram illustrating a structural example of a notch filter according to the embodiment. In addition, FIGS. 6 to 8 are diagrams illustrating structural examples of a Gm-C filter which constitutes the notch filter of the embodiment.

As illustrated in FIG. 3, the filter circuit of the embodiment is constructed having an OTA 1 which functions as a buffer amplifier, a plurality of low-pass notch filters $2_{-1}$, $2_{-2}$, and $2_{-3}$ which are cascaded to a post-stage of the OTA 1, and a plurality of high-pass notch filters $3_{-1}$, $3_{-2}$, and $3_{-3}$ which are cascaded to a post-stage of the plurality of low-pass notch filters $2_{-1}$, $2_{-2}$, and $2_{-3}$. Then, a high-dimensional band-pass filter is constructed by cascading the plurality of low-pass notch filters $2_{-1}$, $2_{-2}$, and $2_{-3}$, and the plurality of high-pass notch filters $3_{-1}$, $3_{-2}$ and $3_{-2}$.

The OTA 1 is constructed as illustrated in FIG. 4, The filter circuit of the embodiment including this OTA 1 is constructed by CMOS processing, and for example, is integrated in one chip. The OTA 1 has a large output impedance because it becomes a current output because of its circuit structure.

As shown in FIG. 5, any of the plurality of low-pass notch filters $2_{-1}$, $2_{-2}$, and $2_{-3}$, and the plurality of high-pass notch filters $3_{-1}$, $3_{-2}$ and $3_{-3}$ is constructed such that an output of a low-pass filter 11 and an output of a high-pass filter 12 are inputted, into an adder 13 using the low-pass filter (LPF) 11, high-pass filter (RTF) 12, and adder 13.

Here, the plurality of low-pass notch filters $2_{-1}$, $2_{-2}$, and $2_{-3}$ are constructed by increasing a Q of the low-pass filter 11 and decreasing a Q of the high-pass filter 12. On the other hand, the plurality of high-pass notch filters $3_{-1}$, $3_{-2}$, and $3_{-3}$ are constructed by decreasing the Q of the low-pass filter 11 and increasing the Q of the high-pass filter 12.

The low-pass filters 11 and high-pass filters 12 which constitute the plurality of low-pass notch filters $2_{-1}$, $2_{-2}$, $2_{-3}$ and the plurality of high-pass notch filters $3_{-1}$, $3_{-2}$, and $3_{-3}$ are constructed of Gm-C filters. For example, the low-pass filter 11 with a high Q constructing the low-pass notch filters $2_{-1}$, $2_{-2}$, and $2_{-3}$ is constructed as illustrated in FIG. 6, and the high-pass filter 12 with a low Q is constructed as illustrated in FIG. 7. In addition, the low-pass filter 11 with a low Q constituting the high-pass notch filters $3_{-1}$, $3_{-2}$, and $3_{-3}$ is constructed as illustrated in FIG. 6, and the high-pass filter 12 with a high Q is constructed as illustrated in FIG. 8.

As illustrated in FIG. 3, by connecting the low-pass notch filters $2_{-1}$, $2_{-2}$, and $2_{-3}$ with an output of the OTA 1 having a large output impedance, it becomes possible to prevent large deviation of a zero point of a BEF, oscillation, and the like from taking place. That is, although the low-pass notch filters $2_{-1}$, $2_{-2}$, and $2_{-3}$ are equipped with the low-pass filter 11 and high-pass filter 12 which are constructed of Gm-C filters, a capacitor is not connected with an input stage of the low-pass filter 11 as illustrated in FIG. 6. In addition, as illustrated in FIG. 7, although the high-pass filter 12 is equipped with a capacitor in an input stage thereof, since a Q is small, influence is small. Hence, since multifeedback is prevented when connecting the low-pass notch filters $2_{-1}$, $2_{-2}$, and $2_{-3}$ with the output of the OTA 1, it is possible to avoid a problem of a zero point of a BEF deviating from a design value, a problem of oscillation, and the like.

In addition, although the high-pass notch filters $3_{-1}$, $3_{-2}$, and $3_{-3}$ constructed having the high Q high-pass filter 12 are connected to the output of the low-pass notch filters $2_{-1}$, $2_{-2}$, and $2_{-3}$, since the low-pass notch filters $2_{-1}$, $2_{-2}$, and $2_{-3}$ have OP amplifier construction having a small output impedance, problems such as large deviation of a zero point of a BEF, and oscillation do not arise.

In three stages in the construction of FIG. 3, although cascade connections of the low-pass notch filters $2_{-1}$, $2_{-2}$, and $2_{-3}$, and the high-pass notch filters $3_{-1}$, $3_{-2}$, and $3_{-3}$ are made respectively, this is only a mere example and the number of stages of cascade connection may be other number of stages than three. For example, although FIG. 3 illustrates such a connection method as OTA+LPN1+LPN2+LPN3+KPN1+HPN2+HPN3, it may be OTA+LPN1+HPN1.

Moreover, in the construction of FIG. 3, although the structural example of cascading the plurality of low-pass notch filters $2_{-1}$, $2_{-2}$, and $2_{-3}$ to the post-stage of the OTA 1, and further cascading the plurality of high-pass notch filters $3_{-1}$, $3_{-2}$, and $3_{-3}$ to the post-stage is described, it is not limited to this. That is, as long as a low-pass notch filter is connected at least immediately after the OTA 1, other connection methods may be used than that as illustrated in FIG. 3.

For example, a connection method such as OTA+LPN1+HPN1+LPN2+HPN2+LPN3+HPN3 may be used. Nevertheless, in the case of such a connection method as illustrated in FIG. 3, a distance between an OTA, having a large output impedance, and a high-pass filter having a high Q (HPN) becomes far. Therefore, since it becomes hard that the OTA is influenced by a capacitor having a small capacitance and being connected to an input stage of the high-pass filter having a high Q, it is preferable because the problem that a aero point of a BEF deviates from a design value is avoided, and hence, it is possible to obtain characteristics closer to desired characteristics.

Figure 9:
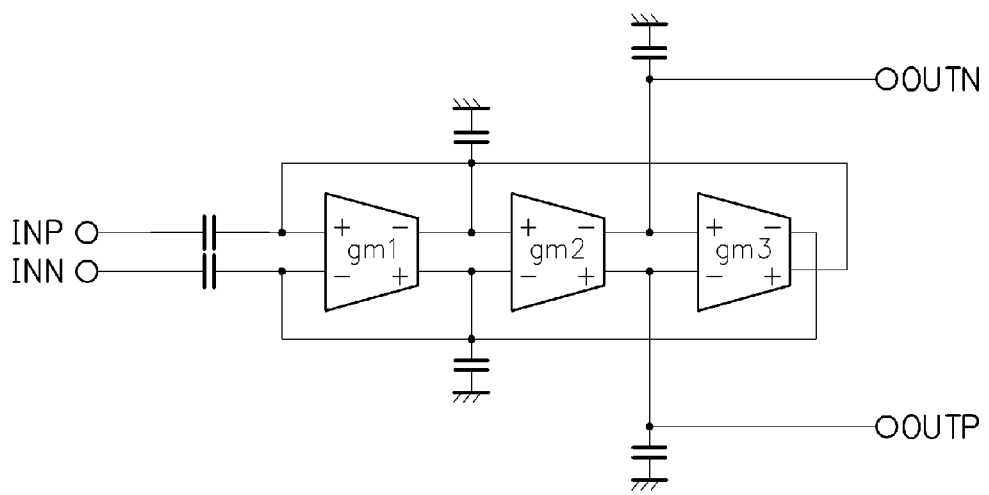
FIG. 9 is a diagram illustrating a structural example of a band-pass filter constructed of a Gm-C filter.

In addition, in addition to the construction illustrated in FIG. 3, a filter circuit may be constructed by connecting band-pass filters with the input side of the OTA 1 and the output side of the high-pass notch filter $3_{-3}$. The band-pass filter in this case is also constructed of, for example, Gm-C filters. When the band-pass filter is constructed of the Gm-C filters, it becomes as illustrated in FIG. 9.

Figure 10:
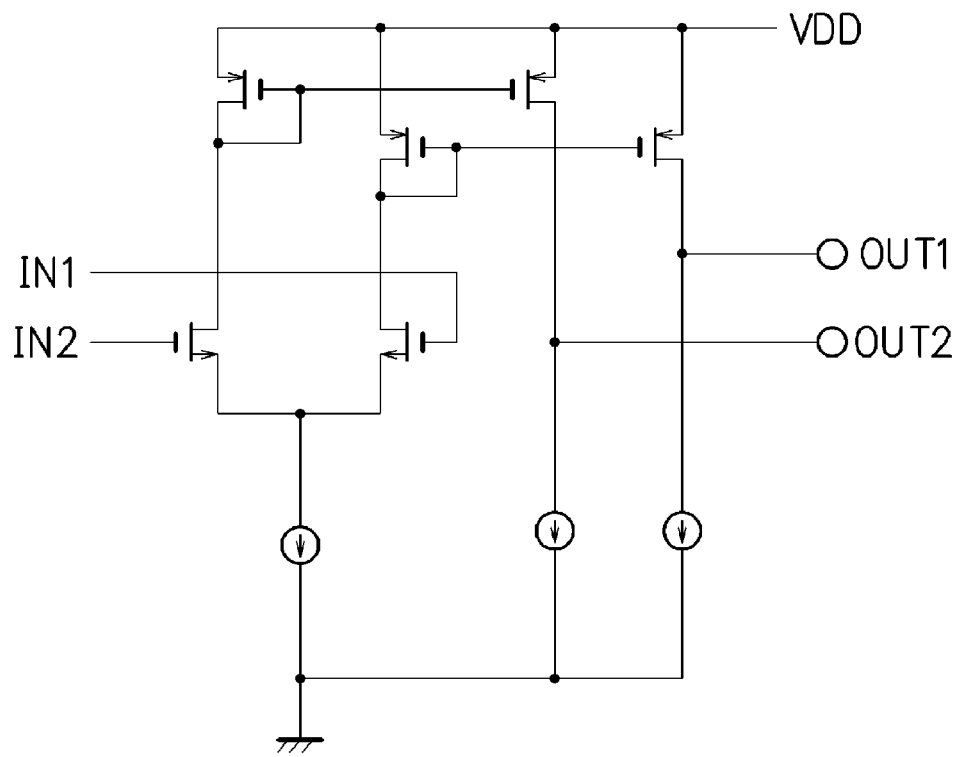
FIG. 10 is a diagram illustrating a structural example of a current output differential amplifier used for the filter circuit according to the embodiment.

Furthermore, a current output differential amplifier may be used instead of the OTA 1. The current output differential amplifier is constructed, for example, as illustrated in FIG. 10. Since this current output differential amplifier is also a current output type, an output impedance becomes large. Hence, also when the current output differential amplifier is used instead of the OTA 1, an effect same as those mentioned above is expectable.

Figure 11:
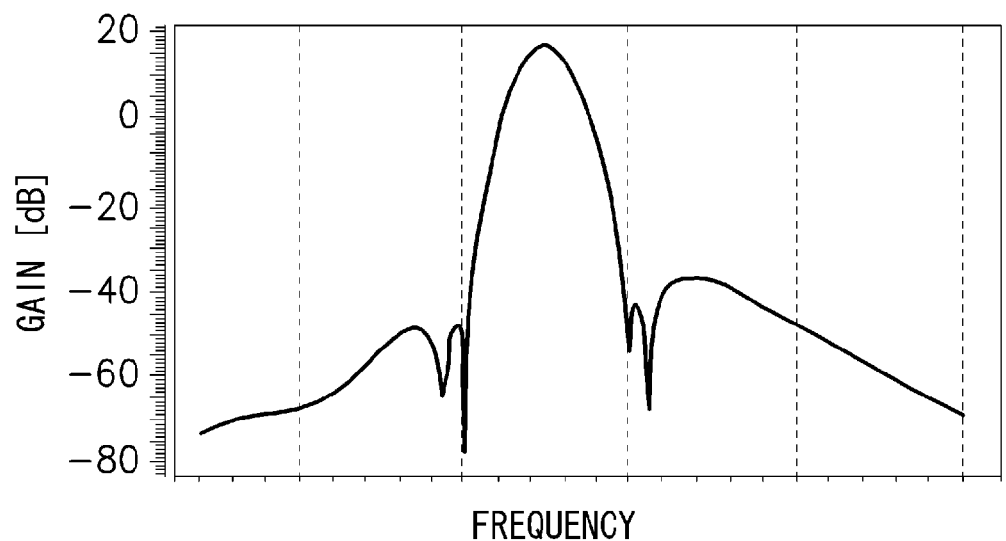
FIG. 11 is a graph illustrating characteristics of the band-pass filter according to the filter circuit of the embodiment.
Figure 12:
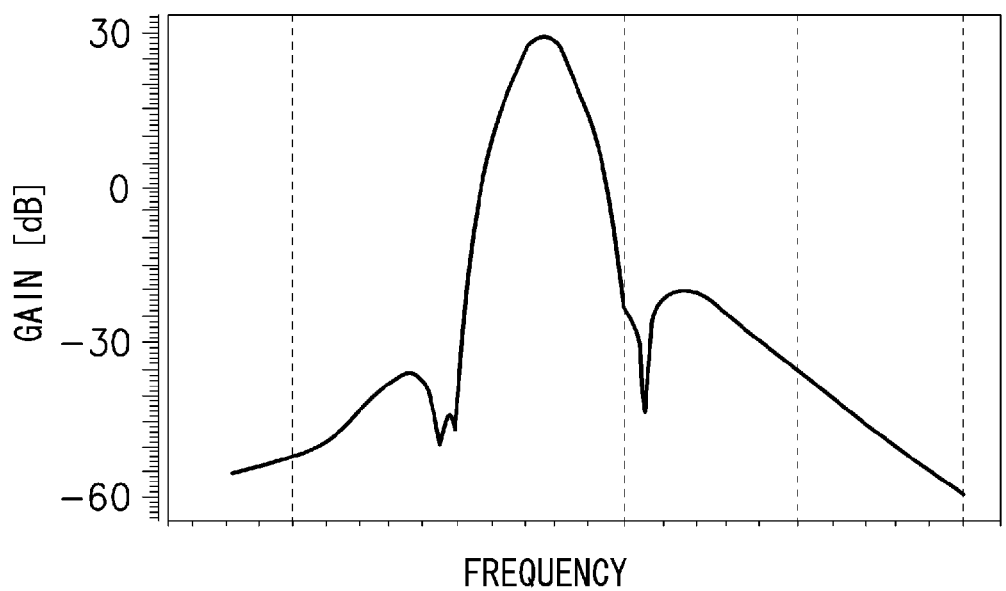
FIG. 12 is a graph illustrating characteristics of a band-pass filter according to a conventional filter circuit.

FIG. 11 is a graph illustrating characteristics of the band-pass filter according to the filter circuit of the embodiment. In addition, FIG. 12 is a graph illustrating characteristics of a band-pass filter according to a conventional filter circuit. In addition, FIG. 11 illustrates characteristics in the case of constructing a 16-dimensional band-pass filter with such connection as BPF1+BPF2+OTA+LPN1+LPN2+HPN1+HPN2+BPF3+BFF4 (one stage of filter becomes a 2-dimensional filter). In addition, FIG. 12 illustrates characteristics in the case of constructing a 16-dimensional band-pass filter with such connection, as BPF1+BPF2+OTA+HPN1+HPN2+LPN1+LPN2+BPF3+BPF4.

Although an accurate zero point in accordance with a design value is not obtained in the conventional example (construction of connecting HPNs after the OTA) illustrated in FIG. 12, a zero point substantially in accordance with a design value is obtained in the embodiment (construction of connecting LPNs after the OTA) illustrated in FIG. 11. In addition, a gain of the conventional example becomes larger by 15 dB, and it turns out that it tends to oscillate.

As described above in detail, according to the embodiment, in the filter circuit constructed by using the OTA 1 and the notch filters $2_{-1}, 2_{-2}, 2_{-3}, 3_{-1}, 3_{-2},$ and $3_{-3}$ which are constructed of the Gm-C filters, it is possible to obtain characteristics in accordance with design values with avoiding the problem that a zero point of a BEF deviates from a design value, and problems such as oscillation.

In addition, all the above-mentioned embodiments are only what show specific examples at the time of implementing the present invention, and the technical scope of the present invention must not be restrictively interpreted by these. That is, the present invention can be implemented in various forms without deviating from its spirit or its main features.

INDUSTRIAL APPLICABILITY

The filter circuit of the present Invention is useful to a filter circuit which constitutes a band-pass filter with combining a high-pass notch filter with a low-pass notch filter which are constructed of the Gm-C filters, and connects a current output type buffer amplifier with its input stage. For example, it is possible to apply it to an IF filter with which radio communication equipment, such as a radio receiver, is equipped.

The invention claimed is:

1. A filter circuit, comprising:
   a current output type buffer amplifier; and
   a plurality of low-pass notch filters and a plurality of high-pass notch filters which are cascaded to a post-stage of the buffer amplifier,
   wherein the low-pass notch filter is connected at least immediately after the buffer amplifier, and a high-dimensional band-pass filter is constructed by cascading the plurality of low-pass notch filters and the plurality of high-pass notch filters, and
   wherein the plurality of low-pass notch filters are cascaded to a post-stage of the buffer amplifier, and the plurality of high-pass notch filters are cascaded to a post-stage of the plurality of low-pass notch filters.

2. The filter circuit according to claim 1, wherein the buffer amplifier is constructed of an OTA or a current output differential amplifier.

3. The filter circuit according to claim 1, wherein at least one of the low-pass notch filters and at least one of the high-pass notch filters are constructed of Gm-C filters.

* * * * *